United States Patent
Cohen

(10) Patent No.: US 10,527,695 B2
(45) Date of Patent: Jan. 7, 2020

(54) SYSTEMS AND METHODS FOR EFFICIENT MAGNETIC RESONANCE FINGERPRINTING SCHEDULING

(71) Applicant: The General Hospital Corporation, Boston, MA (US)

(72) Inventor: Ouri Cohen, Teaneck, NJ (US)

(73) Assignee: The General Hospital Corporation, Boston, MA (US)

(*) Notice: Subject to any disclaimer, the term of this patent is extended or adjusted under 35 U.S.C. 154(b) by 136 days.

(21) Appl. No.: 15/804,084

(22) Filed: Nov. 6, 2017

(65) Prior Publication Data

US 2018/0156882 A1 Jun. 7, 2018

Related U.S. Application Data

(60) Provisional application No. 62/430,008, filed on Dec. 5, 2016.

(51) Int. Cl.
*G01V 3/00* (2006.01)
*G01R 33/48* (2006.01)
(Continued)

(52) U.S. Cl.
CPC ..... *G01R 33/4828* (2013.01); *G01R 33/5608* (2013.01); *G01R 33/543* (2013.01)

(58) Field of Classification Search
CPC .................................................. G01R 33/4828
(Continued)

(56) References Cited

U.S. PATENT DOCUMENTS 8,723,518 B2 5/2014 Seiberlich
2015/0302297 A1* 10/2015 Griswold ........... G01R 33/5608
706/23
(Continued)

FOREIGN PATENT DOCUMENTS

WO 2015160400 10/2015

OTHER PUBLICATIONS

Cohen, O. et al, "MR Fingerprinting Trajectory Optimization", Proc. Intl. Soc. Magn. Reson. Med. 22 (2014).
(Continued)

*Primary Examiner* — Louis M Arana
(74) *Attorney, Agent, or Firm* — Quarles & Brady LLP

(57) ABSTRACT

A system and method is provided for estimating quantitative parameters of a subject using a magnetic resonance system. The method includes using a neural network, estimating acquisition parameters that are selected to direct a magnetic resonance system to generate a plurality of different signal evolutions that elicit discrimination between different quantitative parameters in a desired number of repetition time (TR) periods. The method also includes acquiring data with the magnetic resonance system by performing a plurality of pulse sequences using the estimated acquisition parameters, where the acquired data representing the plurality of different signal evolutions that elicit discrimination between different quantitative parameters. The method further includes estimating quantitative parameters of the subject by comparing the acquired data with a dictionary database comprising a plurality of different signal templates and generating a report indicating the quantitative parameters.

10 Claims, 2 Drawing Sheets

(51) Int. Cl.
*G01R 33/56* (2006.01)
*G01R 33/54* (2006.01)

(58) Field of Classification Search
USPC .......................................... 324/309, 307, 306
See application file for complete search history.

(56) References Cited

U.S. PATENT DOCUMENTS

2016/0349341 A1    12/2016  Cohen
2018/0292484 A1*   10/2018  Hoppe .................... G01R 33/50
2019/0094322 A1*    3/2019  Braun .................... G01R 33/56

OTHER PUBLICATIONS

Iman, Ronald L. "Latin Hypercube Sampling." Encyclopedia of Quantitative Risk Analysis and Assessment 3 (2008).

* cited by examiner

SYSTEMS AND METHODS FOR EFFICIENT MAGNETIC RESONANCE FINGERPRINTING SCHEDULING

CROSS-REFERENCE TO RELATED APPLICATIONS

This application is based on, claims priority to, and incorporates herein by reference in its entirety U.S. Provisional Application Ser. No. 62/430,008, filed Dec. 5, 2016, and entitled, "SYSTEMS AND METHODS FOR EFFICIENT MAGNETIC RESONANCE FINGERPRINTING SCHEDULING."

STATEMENT REGARDING FEDERALLY SPONSORED RESEARCH

N/A

BACKGROUND OF THE DISCLOSURE

The present disclosure relates to systems and methods for nuclear magnetic resonance ("NMR") or magnetic resonance imaging ("MRI") processes. More particularly, systems and methods are described for improved magnetic resonance fingerprinting applications.

Magnetic resonance fingerprinting ("MRF") is an technique that enables quantitative mapping of tissue or other material properties based on varied measurements, such as random or pseudorandom variations, of the subject or object. Examples of parameters that can be mapped include longitudinal relaxation time, $T_1$; transverse relaxation time, $T_2$; main magnetic field map, $B_0$; and proton density, $\rho$. MRF is generally described in U.S. Pat. No. 8,723,518, which is herein incorporated by reference in its entirety.

The varied measurements obtained in MRF techniques are achieved by varying the acquisition parameters from one repetition time ("TR") period to the next, which creates a time series of images with varying contrast. Examples of acquisition parameters that can be varied include flip angle, radio frequency ("RF") pulse phase, TR, echo time ("TE"), and sampling patterns, such as by modifying one or more readout encoding gradients.

The data acquired with MRF techniques are compared with a dictionary of signal models, or templates, that have been generated for different acquisition parameters from magnetic resonance signal models, such as Bloch equation-based physics simulations. This comparison allows estimation of the desired physical parameters, such as those mentioned above. The parameters for the tissue or other material in a given voxel are estimated to be the values that provide the best signal template matching.

Often, a slice-selective, highly undersampled spiral k-space acquisition is utilized for two-dimensional MRF acquisitions. In many instances, a spiral trajectory is changed from one time point (e.g., TR period) to the next. To enable accurate parameter estimation, for each imaging slice, upwards of 1000-2000 time points are acquired with a TR that is typically about 10 milliseconds. This results in an acquisition time of around 10-20 seconds per imaging slice. To create high-resolution volumetric parameter maps with 1 mm slice thickness, approximately 120 imaging slices will have to be imaged, resulting in a total acquisition time of 20-40 minutes. This acquisition time is quite lengthy and limits the widespread clinical usage of MRF techniques.

Given the above, there remains a need for improved an MRF acquisition techniques.

SUMMARY OF THE DISCLOSURE

The present disclosure overcomes the aforementioned drawbacks by providing a system and method for estimating quantitative parameters of a subject using a magnetic resonance imaging ("MRI") or nuclear magnetic resonance ("NMR") system, which includes estimating acquisition parameters that are optimized or otherwise selected to direct an MRI system to generate a plurality of different signal evolutions that maximize or otherwise improve discrimination between different quantitative parameters in a minimized or other desired number of repetition time ("TR") periods. The method includes acquiring data with the system by directing the system to perform a plurality of pulse sequences using the selected acquisition parameters, the acquired data representing the plurality of different signal evolutions that improve or otherwise select discrimination between different quantitative parameters. Quantitative parameters of the subject are then estimated by comparing the acquired data with a dictionary database comprising a plurality of different signal templates.

In accordance with one aspect of the present disclosure, a method is provided for estimating quantitative parameters of a subject using a magnetic resonance system. The method includes using a neural network, estimating acquisition parameters that are selected to direct a magnetic resonance system to generate a plurality of different signal evolutions that elicit discrimination between different quantitative parameters in a desired number of repetition time (TR) periods. The method also includes acquiring data with the magnetic resonance system by performing a plurality of pulse sequences using the estimated acquisition parameters, where the acquired data representing the plurality of different signal evolutions that elicit discrimination between different quantitative parameters. The method further includes estimating quantitative parameters of the subject by comparing the acquired data with a dictionary database comprising a plurality of different signal templates and generating a report indicating the quantitative parameters.

In accordance with another aspect of the present disclosure, magnetic resonance (MR) system is provided that includes a magnet system configured to generate a polarizing magnetic field about at least a portion of a subject arranged in the MR system and a magnetic gradient system including a plurality of magnetic gradient coils configured to apply at least one magnetic gradient field to the polarizing magnetic field. The MR system also includes a radio frequency (RF) system configured to apply an RF field to the subject and to receive magnetic resonance signals from the subject using a coil array and a computer system. The computer system is programmed to use a neural network to estimate acquisition parameters that are selected to direct a magnetic resonance system to generate a plurality of different signal evolutions that elicit discrimination between different quantitative parameters in a desired number of repetition time (TR) periods. The computer system is also programmed to cause the gradient system and the RF system perform a plurality of pulse sequences using the estimated acquisition parameters, where the acquired data representing the plurality of different signal evolutions that elicit discrimination between different quantitative parameters. The computer system is further programmed to estimate quantitative parameters of the subject by comparing the acquired data with a dictionary database comprising a plurality of different signal templates.

The foregoing and other aspects and advantages will appear from the following description. In the description, reference is made to the accompanying drawings that form a part hereof, and in which there is shown by way of illustration a preferred embodiment. This embodiment does not necessarily represent the full scope of the invention, however, and reference is made therefore to the claims and herein for interpreting the scope of the invention.

DETAILED DESCRIPTION

Figure 1:
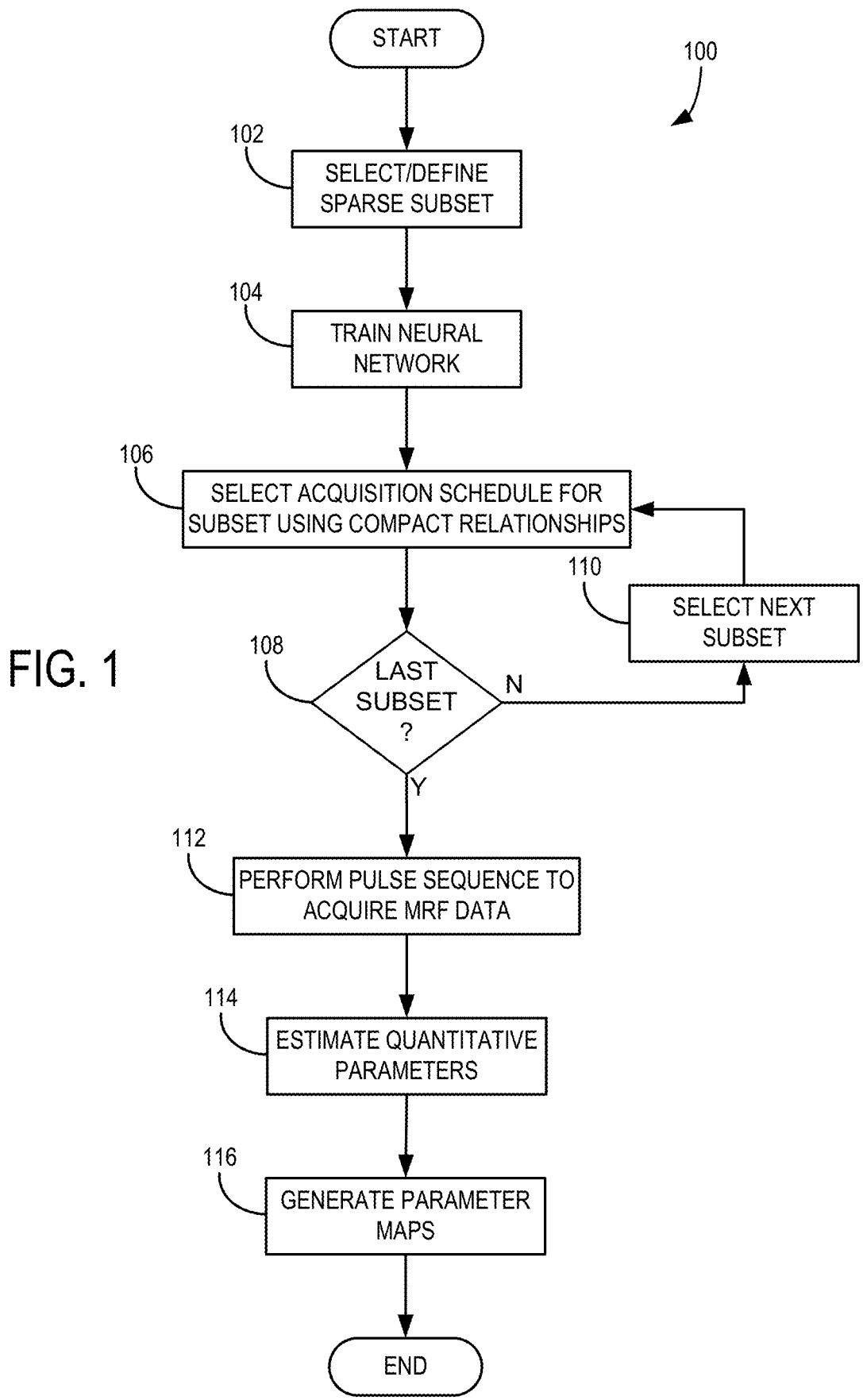
FIG. 1 is a flowchart setting forth some examples of steps of a non-limiting example method for designing and implementing data acquisition strategies for magnetic resonance fingerprinting processes that maximize or otherwise achieve a desired discrimination between the quantitative parameters to be estimated in generated MRF reports.

Described here are systems and methods for designing or otherwise improving magnetic resonance fingerprinting ("MRF") acquisitions by selecting acquisition parameters that are efficient, while increasing the discrimination between the physical parameters to be estimated. The systems and methods may also include implementing pulse sequences that rapidly acquire large volumes of k-space data.

In general, MRF techniques utilize a data acquisition scheme that causes signals from different materials or tissues to be spatially and temporally incoherent by varying acquisition parameters between subsequent blocks or repetitions of the pulse sequence. Examples of acquisition parameters that can be varied include flip angle ("FA"), radio frequency ("RF") pulse phase, repetition time ("TR"), echo time ("TE"), and sampling patterns, such as by modifying readout encoding gradients. The acquisition parameters can be varied in a random manner, pseudorandom manner, or other manner that results in signals from different materials or tissues to be spatially incoherent, temporally incoherent, or both. For example, in some instances, the acquisition parameters can be varied according to a non-random or non-pseudorandom pattern that otherwise results in signals from different materials or tissues to be spatially incoherent, temporally incoherent, or both.

As a result of the spatial and temporal incoherence imparted by an acquisition scheme utilizing multiple parameter values, each material or tissue is associated with a unique signal evolution or "fingerprint," that is a function of multiple different physical parameters, including longitudinal relaxation time, $T_1$; transverse relaxation time, $T_2$; main magnetic field map, $B_0$; and proton density, $\rho$.

Quantitative parameter maps are then generated from the acquired signals based on a comparison of the signals to a predefined dictionary of predicted signal evolutions. Each of these dictionaries is associated with different combinations of materials and acquisition parameters. As an example, the comparison of the acquired signals to a dictionary can be performed using any suitable matching or pattern recognition technique. This comparison results in the selection of a signal vector, which may constitute a weighted combination of signal vectors, from the dictionary that best correspond to the observed signal evolution. The selected signal vector includes values for multiple different quantitative parameters, which can be extracted from the selected signal vector and used to generate the relevant quantitative parameter maps.

To uniquely distinguish between various different tissue parameters, current implementations of MRF generally require a large number of acquisitions (e.g., greater than 1000) for each phase encoding line. Furthermore, the generation of a suitable dictionary, and the subsequent matching process, requires significant computational resources and processing time. The large number of acquisitions needed for conventional MRF applications also results in an increased specific absorption rate ("SAR") and long scan times. To avoid excessive scan times, current MRF acquisition techniques commonly include undersampling k-space, which leads to appreciable errors and increased image artifacts.

It is an aspect of the present disclosure to provide a system and method for selecting acquisition parameters and scheduling is efficient. As will now be described in more detail, the systems and methods of the present disclosure provide techniques for optimization of long acquisition schedules or multiple parameter maps that can be implemented without sacrificing optimization accuracy.

In MRF schedule optimization, the acquisition FA and TR values are chosen by defining an optimization dictionary of the ensemble of tissue parameter values in the anatomy of interest, and then calculating the discrimination between the entries of the optimization dictionary for the current set of FAs and TRs. The schedule is then varied to find the one that maximizes the discrimination. Unfortunately, the schedule search-space grows exponentially with increasing number of measurements. Moreover, the computational time required for each cost function evaluation grows with the number of measurements as well. The combination of these facts and the limited computational time available result in a smaller fraction of the acquisition schedule hyperspace being explored, which increases the likelihood that the algorithm will converge to a local, rather than global, minimum. A similar problem arises when optimizing over multiple tissue parameters. Because the optimization dictionary also grows exponentially with increasing number of tissue parameters, optimization of even short schedules quickly becomes intractable.

The techniques described here make overcome these problems by leveraging the compactness property of neural networks ("NN"). In particular, FIG. 1 provides some non-limiting example steps of a method in accordance with the present disclosure.

Referring now to FIG. 1, a flowchart is illustrated as setting forth the steps of one non-limiting example method 100 for estimating quantitative parameters (e.g., $T_1$, $T_2$, $B_0$, and proton density, $\rho$) from data acquired using acquisition parameters that have been selected to reduce the number of acquisitions necessary to desirably sample the quantitative parameter space. The method 100 begins by selecting or otherwise defining a sparse subset of the full hyperspace of acquisition parameters (e.g., FA, TR) to reduce the number of acquisitions necessary to sufficiently sample the quantitative parameter space, as indicated at step 102. The subset can be chosen to adequately cover the full hyperspace using sampling methods, such as latin hypercube sampling. Because only a subset of the hyperspace is evaluated, the number of expensive cost function evaluations is limited.

A NN is then trained using the defined subset of parameters to obtain a compact relationship between the acquisition schedule and the resulting discrimination, as indicated at step 104. A compact relationship may refer to acquisition parameters that generate a plurality of different signal evolutions that elicit discrimination between different quantitative parameters in a desired number of TR periods. The discrimination may be a maximized discrimination or may be at least above a desired or selected threshold and the desired number of TR periods may be a minimized number of TR periods. As a non-limiting example, the NN may be trained to obtain a compact relationship between the FA/TR schedule for acquisition blocks of an MRF pulse sequence made up of N acquisition blocks, and the resulting signal discrimination, at process block 106.

Because neural networks can compactly represent complex functions, the resulting NN requires less memory and storage than inefficient methods, such as described. Also, once a compact representation of the acquisition process has been obtained, the evolution of the magnetization for each tissue type and acquisition schedule can be quickly and cheaply calculated.

The compact relationship determined above can be used to evaluate a greater portion of the acquisition parameter hyperspace, which allows for more globally optimal or approximately optimal acquisition parameter schedules to be identified. Thus, at decision block 108, if the subset of the full hyperspace that was processed at step 106 was not the last, the next subset of the full hyperspace is selected at step 110 and step 106 is repeated. This process continues until the last subset is reached at decision block 108.

With an acquisition schedule determined, an MRF acquisition can be performed. That is, MRF data is acquired at process bock 112 by directing an MRI system to perform pulse sequences using the acquisition parameters using the acquisition schedule determined using the NN. The pulse sequence can be any suitable pulse sequence for obtaining MRF data, but in some configurations the pulse sequence used can be an EPI pulse sequence, which may be a spin-echo ("SE") EPI sequence or a gradient-recalled echo ("GRE") EPI sequence.

Using an EPI pulse sequence has the added benefit that k-space can be fully sampled in rapid fashion, which reduces the total number of acquisitions required overall. Reducing the total number of acquisitions not only provides a time saving measure, but also reduces the computational burden of matching the acquired data to a pre-computed dictionary because a smaller dictionary can be used with the reduced number of acquisitions.

Referring still to FIG. 1, the method continues by then estimating quantitative parameters from the MRF data by, for example, matching the signals or reconstructed images to one or more pre-computed dictionaries, as indicated at step 114. Conventional matching algorithms can be used; however, in some configurations, an adaptive matching algorithm, such as the one described in U.S. Patent Application Ser. No. 62/025,268 and PCT Application No. PCT/US15/11948, which are herein incorporated by reference in their entirety, can also be used. Parameter maps can then be generated using the estimated quantitative parameters, as indicated at step 116.

Figure 2:
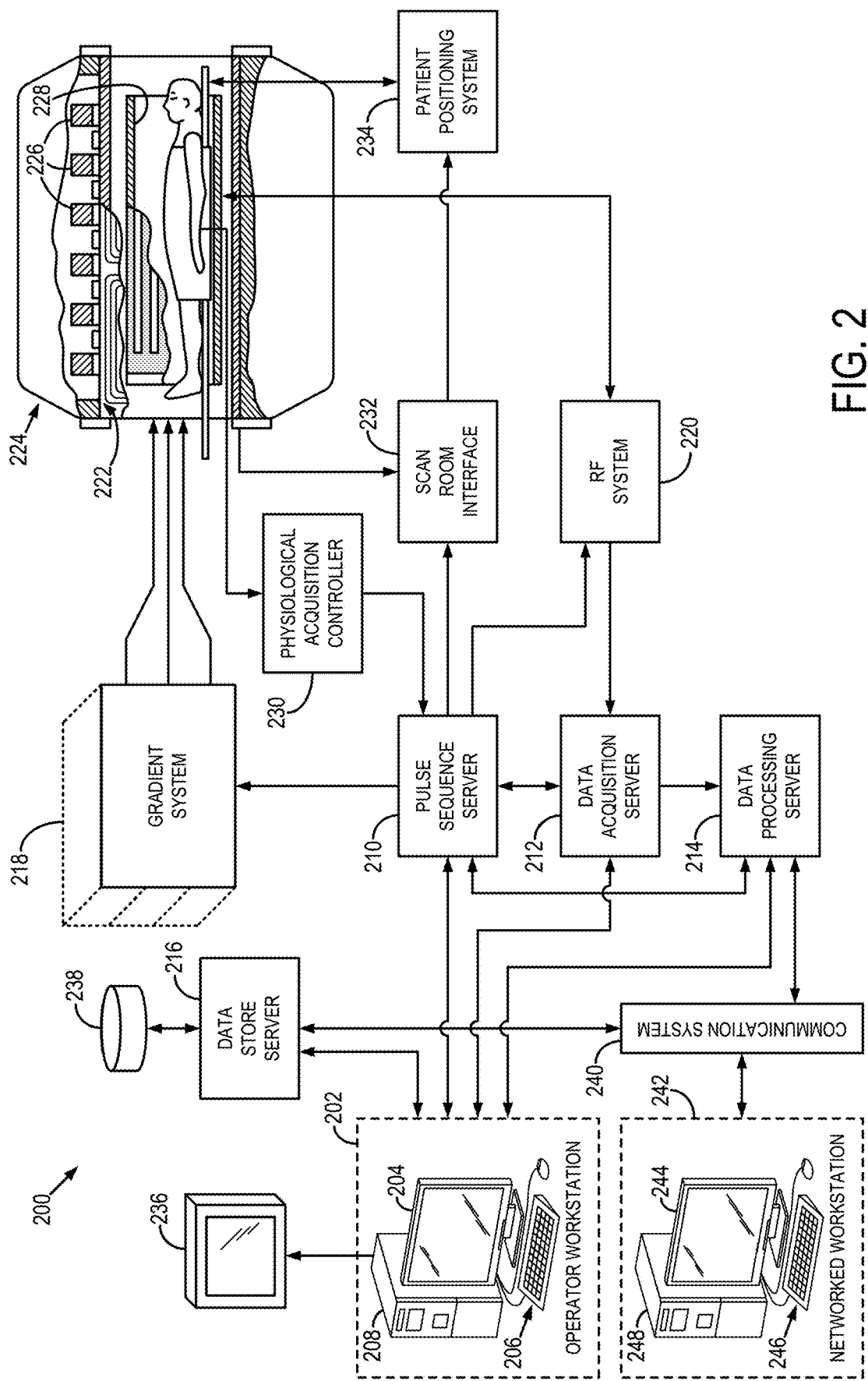
FIG. 2 is a block diagram of an example of a magnetic resonance imaging ("MRI") system for use in accordance with the present disclosure, such as to carry out the process described with respect to FIG. 1.

Referring particularly now to FIG. 2, an example of a magnetic resonance imaging ("MRI") system 200, for use in accordance with the present disclosure, is illustrated. The MRI system 200 includes an operator workstation 202, which will typically include a display 204; one or more input devices 206, such as a keyboard and mouse; and a processor 208. The processor 208 may include a commercially available programmable machine running a commercially available operating system. The operator workstation 202 provides the operator interface that enables scan prescriptions to be entered into the MRI system 200. In general, the operator workstation 202 may be coupled to four servers: a pulse sequence server 210; a data acquisition server 212; a data processing server 214; and a data store server 216. The operator workstation 202 and each server 210, 212, 214, and 216 are connected to communicate with each other. For example, the servers 210, 212, 214, and 216 may be connected via a communication system 240, which may include any suitable network connection, whether wired, wireless, or a combination of both. As an example, the communication system 240 may include both proprietary or dedicated networks, as well as open networks, such as the internet.

The pulse sequence server 210 functions in response to instructions downloaded from the operator workstation 202 to operate a gradient system 218 and a radiofrequency ("RF") system 220. As a non-limiting example, the process described above for using the NN to create a desired/optimized MRF acquisition schedule may be preformed using the pulse sequence server 210, or other computers or servers. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding magnetic resonance signals. The gradient coil assembly 222 forms part of a magnet assembly 224 that includes a polarizing magnet 226 and a whole-body RF coil 228.

RF waveforms are applied by the RF system 220 to the RF coil 228, or a separate local coil (not shown in FIG. 2), in order to perform the prescribed magnetic resonance pulse sequence. Responsive magnetic resonance signals detected by the RF coil 228, or a separate local coil (not shown in FIG. 2), are received by the RF system 220, where they are amplified, demodulated, filtered, and digitized under direction of commands produced by the pulse sequence server 210. The RF system 220 includes an RF transmitter for producing a wide variety of RF pulses used in MRI pulse sequences. The RF transmitter is responsive to the scan prescription and direction from the pulse sequence server 210 to produce RF pulses of the desired frequency, phase, and pulse amplitude waveform. The generated RF pulses may be applied to the whole-body RF coil 228 or to one or more local coils or coil arrays (not shown in FIG. 2).

The RF system 220 also includes one or more RF receiver channels. Each RF receiver channel includes an RF preamplifier that amplifies the magnetic resonance signal received by the coil 228 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \tag{1}$$

and the phase of the received magnetic resonance signal may also be determined according to the following relationship:

$$\varphi = \tan^{-1}\left(\frac{Q}{I}\right). \tag{2}$$

The pulse sequence server 210 also optionally receives patient data from a physiological acquisition controller 230. By way of example, the physiological acquisition controller 230 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized magnetic resonance signal samples produced by the RF system 220 are received by the data acquisition server 212. The data acquisition server 212 operates in response to instructions downloaded from the operator workstation 202 to receive the real-time magnetic resonance data and provide buffer storage, such that no data is lost by data overrun. In some scans, the data acquisition server 212 does little more than pass the acquired magnetic resonance data to the data processor server 214. However, in scans that require information derived from acquired magnetic resonance data to control the further performance of the scan, the data acquisition server 212 is programmed to produce such information and convey it to the pulse sequence server 210. For example, during prescans, magnetic resonance data is acquired and used to calibrate the pulse sequence performed by the pulse sequence server 210. As another example, navigator signals may be acquired and used to adjust the operating parameters of the RF system 220 or the gradient system 218, or to control the view order in which k-space is sampled. In still another example, the data acquisition server 212 may also be employed to process magnetic resonance signals used to detect the arrival of a contrast agent in a magnetic resonance angiography ("MRA") scan. By way of example, the data acquisition server 212 acquires magnetic resonance data and processes it in real-time to produce information that is used to control the scan.

The data processing server 214 receives magnetic resonance data from the data acquisition server 212 and processes it in accordance with instructions downloaded from the operator workstation 202. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 214 are conveyed back to the operator workstation 202 where they are stored. Real-time images are stored in a data base memory cache (not shown in FIG. 2), from which they may be output to operator display 212 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the operator workstation 202. The operator workstation 202 may be used by an operator to archive the images, produce films, or send the images via a network to other facilities.

The MRI system 200 may also include one or more networked workstations 242. By way of example, a networked workstation 242 may include a display 244; one or more input devices 246, such as a keyboard and mouse; and a processor 248. The networked workstation 242 may be located within the same facility as the operator workstation 202, or in a different facility, such as a different healthcare institution or clinic.

The networked workstation 242, whether within the same facility or in a different facility as the operator workstation 202, may gain remote access to the data processing server 214 or data store server 216 via the communication system 240. Accordingly, multiple networked workstations 242 may have access to the data processing server 214 and the data store server 216. In this manner, magnetic resonance data, reconstructed images, or other data may exchanged between the data processing server 214 or the data store server 216 and the networked workstations 242, such that the data or images may be remotely processed by a networked workstation 242. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for estimating quantitative parameters of a subject using a magnetic resonance system, the steps of the method comprising:
    (a) using a neural network, estimating acquisition parameters that are selected to direct a magnetic resonance system to generate a plurality of different signal evolutions that elicit discrimination between different quantitative parameters in a desired number of repetition time (TR) periods, wherein the neural network is trained using a subset of hyperspace defined for desired acquisition parameters and wherein the desired number of TR periods is a minimum number of TR periods capable of generating signal evolutions that elicit a discrimination between different quantitative parameters that is above a predetermined threshold;
    (b) acquiring data with the magnetic resonance system by performing a plurality of pulse sequences using the estimated acquisition parameters, the acquired data representing the plurality of different signal evolutions that elicit discrimination between different quantitative parameters;
    (c) estimating quantitative parameters of the subject by comparing the acquired data with a dictionary database comprising a plurality of different signal templates; and
    (d) generating a report indicating the quantitative parameters.

2. The method of claim 1 wherein the estimated acquisition parameters are estimated to generate signal evolutions that maximize discrimination between different quantitative parameters.

3. The method of claim 1 wherein the desired number of TR periods is a minimum number of TR periods capable of generating signal evolutions that maximize discrimination between different quantitative parameters.

4. The method of claim 1 wherein step (a) includes:
(i) selecting the subset of hyperspace defined for desired acquisition parameters;
(ii) using the neural network to obtain a compact relationship between the desired acquisition parameters; and
(iii) using the compact relationship of the neural network to evaluate hyperspace defined for the desired acquisition parameters to estimate acquisition parameters that are selected to direct a magnetic resonance system to generate the plurality of different signal evolutions that elicit discrimination between different quantitative parameters in the desired number of repetition time (TR) periods.

5. The method of claim 1 wherein the desired acquisition parameters include a flip angle (FA) and a repetition time (TR).

6. A magnetic resonance (MR) system, comprising:
a magnet system configured to generate a polarizing magnetic field about at least a portion of a subject arranged in the MR system;
a magnetic gradient system including a plurality of magnetic gradient coils configured to apply at least one magnetic gradient field to the polarizing magnetic field;
a radio frequency (RF) system configured to apply an RF field to the subject and to receive magnetic resonance signals from the subject using a coil array;
a computer system programmed to:
use a neural network to estimate acquisition parameters that are selected to direct a magnetic resonance system to generate a plurality of different signal evolutions that elicit discrimination between different quantitative parameters in a desired number of repetition time (TR) periods, wherein the neural network is trained using a subset of hyperspace defined for desired acquisition parameters and wherein the desired number of TR periods is a minimum number of TR periods capable of generating signal evolutions that elicit a discrimination between different quantitative parameters that is above a predetermined threshold;
cause the gradient system and the RF system perform a plurality of pulse sequences using the estimated acquisition parameters, the acquired data representing the plurality of different signal evolutions that elicit discrimination between different quantitative parameters; and
estimate quantitative parameters of the subject by comparing the acquired data with a dictionary database comprising a plurality of different signal templates.

7. The system of claim 6 wherein the estimated acquisition parameters are estimated to generate signal evolutions that maximize discrimination between different quantitative parameters.

8. The system of claim 6 wherein the desired number of TR periods is a minimum number of TR periods capable of generating signal evolutions that maximize discrimination between different quantitative parameters.

9. The system of claim 6 wherein to estimate the acquisition parameters, the computer system is further programmed to:
select the subset of hyperspace defined for desired acquisition parameters;
use the neural network to obtain a compact relationship between the desired acquisition parameters; and
use the compact relationship of the neural network to evaluate hyperspace defined for the desired acquisition parameters to estimate acquisition parameters that are selected to direct a magnetic resonance system to generate the plurality of different signal evolutions that elicit discrimination between different quantitative parameters in the desired number of repetition time (TR) periods.

10. The system of claim 6 wherein the desired acquisition parameters include a flip angle (FA) and a repetition time (TR).

* * * * *